United States Patent [19]
Koseki

[11] Patent Number: 5,856,750
[45] Date of Patent: Jan. 5, 1999

[54] INTERFACE CIRCUIT HAVING RECEIVING SIDE CIRCUIT FOR CONTROLLING LOGICAL THRESHOLD VALUES

[75] Inventor: Yoichi Koseki, Tokyo, Japan

[73] Assignee: NEC Corporation, Tokyo, Japan

[21] Appl. No.: 807,696

[22] Filed: Feb. 28, 1997

[30] Foreign Application Priority Data

Feb. 28, 1996 [JP] Japan .................................. 8-041036

[51] Int. Cl.⁶ ............................................... H03K 5/153
[52] U.S. Cl. ........................ 327/72; 327/75; 327/76; 327/206; 327/333
[58] Field of Search ............................... 327/72, 74, 76, 327/205, 206, 333

[56] References Cited

U.S. PATENT DOCUMENTS

| | | | |
|---|---|---|---|
| 4,717,839 | 1/1988 | Miller | 327/73 |
| 4,743,779 | 5/1988 | Valley | 327/68 |
| 5,497,112 | 3/1996 | Hoang | 327/74 |
| 5,614,857 | 3/1997 | Lim et al | 327/74 |

FOREIGN PATENT DOCUMENTS

| | | |
|---|---|---|
| 62-180643 | 8/1987 | Japan . |
| 2185110 | 7/1990 | Japan . |
| 7193471 | 7/1995 | Japan . |
| 818432 | 1/1996 | Japan . |

*Primary Examiner*—Kenneth B. Wells
*Attorney, Agent, or Firm*—Sughrue, Mion, Zinn, Macpeak & Seas, PLLC

[57] ABSTRACT

In an interface circuit having a transmitting side circuit, a receiving side circuit and a transmission path connecting the transmitting side circuit and the receiving side circuit in a transmission system for transmitting a predetermined signal between the transmitting and receiving sides, the receiving side circuit has a receiver circuit having threshold control section for independently controlling a logical threshold value corresponding to rise of a received transmitting signal from low level to high level and a logical threshold value corresponding to fall of the received transmitting signal from high level to low level, and a control circuit for controlling the logical threshold values of the receiver circuit through the threshold control section in response to a voltage change in the transmitting signal.

8 Claims, 11 Drawing Sheets

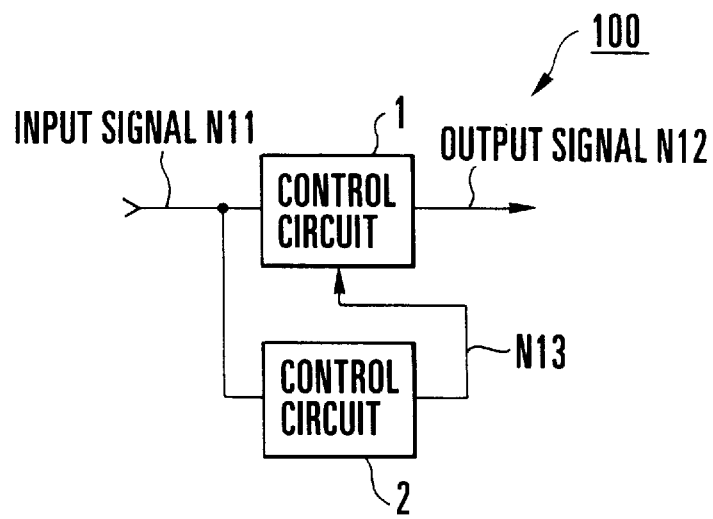
F I G. 1
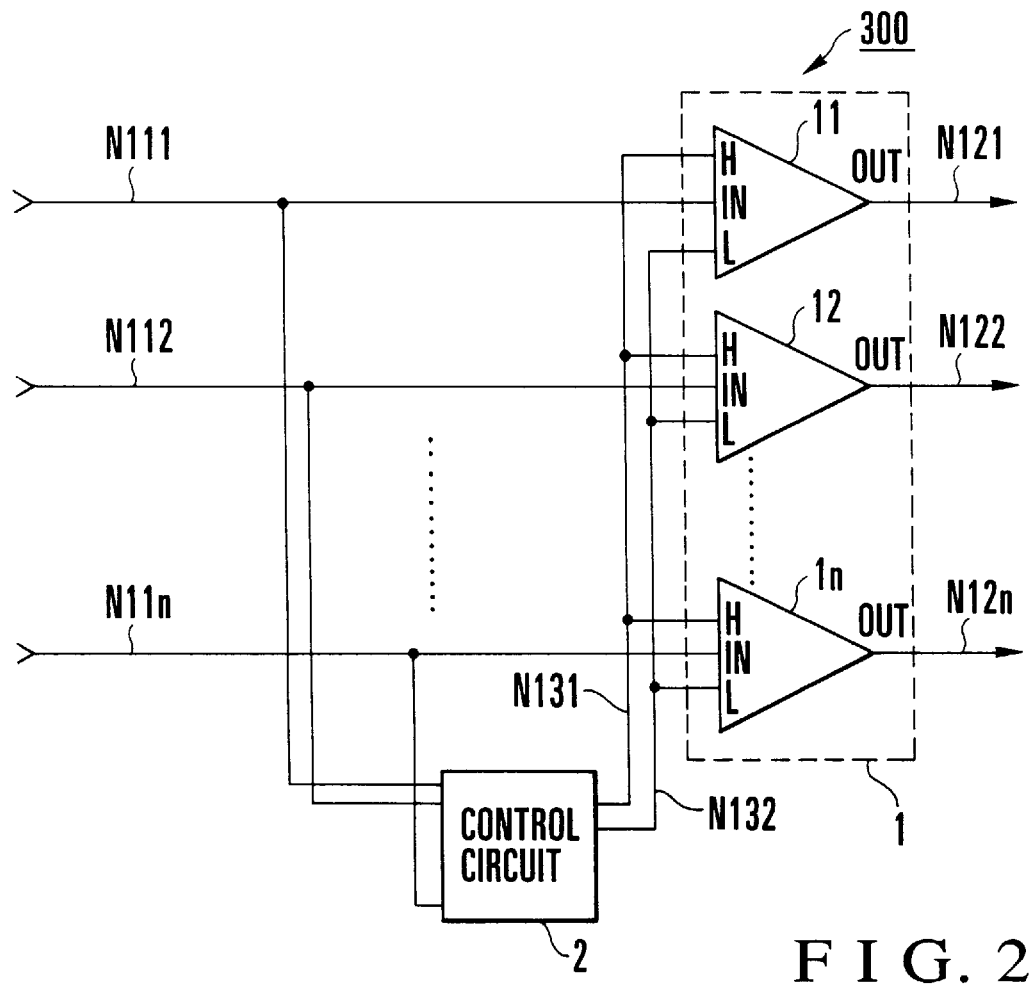
F I G. 2

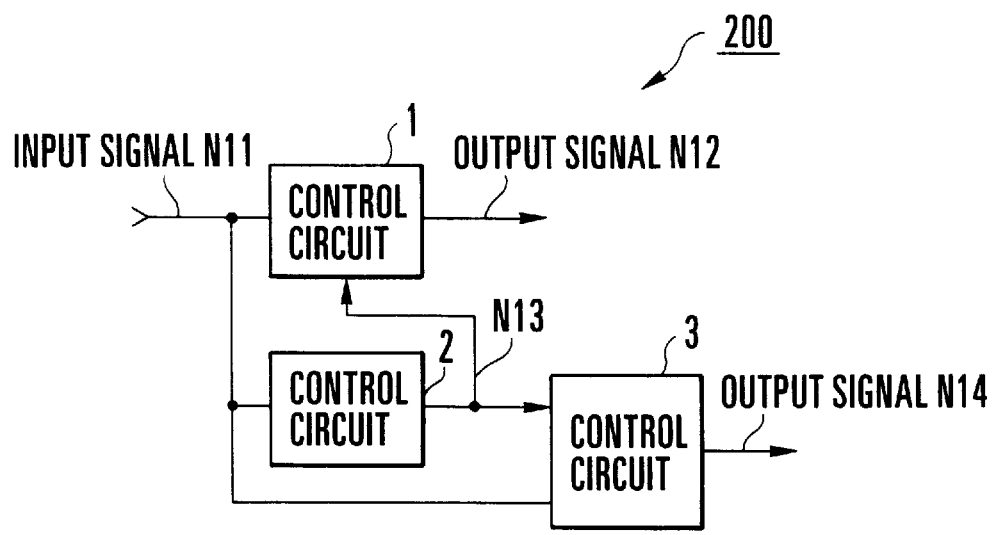
F I G. 6

PRIOR ART

PRIOR ART

PRIOR ART

INTERFACE CIRCUIT HAVING RECEIVING SIDE CIRCUIT FOR CONTROLLING LOGICAL THRESHOLD VALUES

BACKGROUND OF THE INVENTION

The present invention relates to interface circuits and more particularly, to an interface circuit having a receiving side circuit which can control logical threshold values such that the logical threshold values can comply with a received signal even when it varies changes in either a direction toward the supply potential or a direction toward the ground potential, in a system in which a voltage variation occurs in a transmitting signal by reason that a supply voltage power source provided on the sending side differs from that provided on the receiving side or in a signal transmitting system in which noise is contained in a transmitting signal by reason that supply voltage varies.

As a conventional transmission system of this type, a system has been known in which an interface circuit is adapted for the case where different power source systems are provided on the sending and receiving sides in a signal transmission system or for the case where a variation in supply voltage causes a transmitting signal to vary in voltage level and, when a transmitting data signal of opposite polarities in the form of non-inverting and inverting signals is delivered from the sending side, a voltage difference between the received opposite-polarity signals is extracted to decide logic of the transmitting signal on the receiving side.

An example of this type of interface circuit is described in JP-A-2-185110. An interface circuit described in this literature is constructed of an emitter coupled logic (ECL) circuit and has means for obtaining, as a discrimination voltage, a middle voltage between high and low logical levels from a clock signal contained in an input signal supplied from a transmitting system, and means for comparing the obtained discrimination voltage with an input signal level to decide the level of the input signal, thereby making it possible to suppress a decrease in operating margin or a variation in duty which results from a voltage variation caused by, for example, a transmission loss.

Another example is described in JP-A-62-180643. An interface circuit described in this literature uses a ground potential difference between the sending and receiving sides to prevent a change in delay time and a decrease in noise margin and is constructed of an ECL circuit similarly to the aforementioned interface circuit. More specifically, a reference potential Vref for formation of a pulse signal to be transmitted is provided an only the sending side, and the receiving side utilizes the reference potential Vref on the transmitting side to match a reference of comparison potential to the reference on the sending side so that the influence of a difference in ground potential on the delay time may be neglected and signal transmission of wide noise margin may be effected.

On the other hand, an example of an interface circuit adapted for the case where noise is contained in a transmitting signal is described in JP-A-7-193471. This is a semiconductor waveform converting circuit and uses, in a receiver circuit on the receiving side, a Schmitt circuit having such a hysteresis characteristic that the logical threshold value is set to be high corresponding to rise of an input signal and low corresponding to fall of the input signal, thus filling the role of eliminating noise in the transmitting signal. The logical threshold value referred to herein indicates an input signal voltage value which provides an output signal 1of an output signal voltage value equal to ½ of the logical amplitude in an inverter circuit, a buffer circuit, a receiver circuit or a waveform converting circuit.

JP-A-8-18432 discloses an example of an inverter circuit adapted for the case where a transmitting signal obtained on the receiving side becomes a signal exhibiting a gradual change characteristic owing to a long transmission line and a load of large capacity and a large delay time occurs. A receiver circuit uses a circuit in which the logical threshold value is set to be low corresponding to rise of a transmitted input signal and to be high corresponding to fall of the input signal to exhibit a characteristic inverse to the hysteresis characteristic.

The aforementioned conventional interface circuits will be detailed with reference to FIG. 8 schematically showing the construction of an example of conventional interface circuit, FIG. 9A schematically showing the construction of another example of conventional interface circuit and FIG. 9B showing operational characteristics on the sending or transmitting and receiving sides. The interface circuit of FIG. 8 uses as a driver circuit a waveform converter 7 which receives an input signal of a transmitting signal N21 to deliver transmitting signals of opposite polarity signals in the form of non-inverting and inverting signals N22 and N23 of the input signal and uses as a receiver circuit a waveform converter 8 which determines logic of the transmitting signal from a potential difference between the received transmitting signals N22 and N23 to deliver an output signal N24.

In the interface circuit as above, when supply voltage on the transmitting side varies or a transmission loss occurs in the signal transmission line, the transmitting signals N22 and N23 are equally affected by the variation or the loss and in consequence, the potential level relation between the transmitting signals N22 and N23 remains unchanged and the logic can be recognized accurately from the potential difference between the transmitting signals N22 and N23 on the receiving side.

The different conventional interface circuit shown in FIG. 9A has as a driver circuit a waveform converter 9 for comparing a reference potential Vref and an input signal to be transmitted and determining logic of the input signal from the difference and has as a receiver circuit a waveform converter 10. Namely, a reference potential Vref is generated by the driver circuit 9 on the transmitting side and the reference potential Vref is used in the receiver circuit 10, too.

For example, given that the transmitting signal N26 delivered out of the transmitting side driver circuit 9 has a minimum value of high level which is VOH and a maximum value of low level which is VOL, a minimum value for the receiving side receiver circuit 10 to recognize the input signal as high level is VIH and a maximum value for the receiving side receiver circuit 10 to recognize the input signal as low level is VIL, a noise margin NMH for high level is defined by "VOH–VIH" and a noise margin NML for low level is defined by "–(VOL–VIL)".

The transmitting signal N26 and the reference potential Vref are equally affected by a supply voltage variation on the transmitting side and a transmission loss in the signal transmission path. Accordingly, when voltage variations occur in the transmitting signal and the reference potential and the VOH, VOL and Vref shift from threshold value levels N29 to threshold value levels N30 as shown in FIG. 9B, the VIH and VIL shift similarly because the reference potential on the transmitting side equals the reference potential Vref on the transmitting side and noise margins NMH and NML remain unchanged.

When the reference potential of the waveform converter is generated on the transmitting side by itself, the VIH and VIL do not shift to VIH' and VIL' and so the noise margins NMH and NML shift to NMH' and NML', with the result that a characteristic against noise is degraded. In other words, as compared to the case where the reference potential on the receiving side is generated by the waveform converter 10 by itself, the interface circuit can advantageously increase the margin for noise due to the supply voltage variation on the transmitting side and the transmission loss.

Referring to FIG. 10 showing a receiver circuit 22 of an interface circuit for performing transmission of a plurality of signals, the receiver circuit 22 has waveform converters 221, 222 and 223 and decides logic of an input signal from a potential difference between a reference potential and the input signal.

In the receiver circuit, one 221 of the waveform converters 221 receives a clock signal as an input transmitting signal. On the output side, there is provided a reference potential generating circuit 224 for obtaining, as a reference potential of the receiving side waveform converter 22, a middle potential Vref between high and low levels of another transmitting signal from the transmitted clock signal N28. A supply voltage variation on the transmitting side and a transmission loss in the signal transmission path take place in the form of potential changes in high and low levels of the transmitting signal N28.

By using the middle potential between high and low levels as the reference potential of the receiving side waveform converter 22, a voltage variation equal to a voltage variation in the transmitting signal can be taken into the reference potential on the receiving side. Accordingly, as compared to the case where the reference potential of the receiving side waveform converter is generated on the receiving side by itself, the noise margin can be advantageously increased.

Referring to FIG. 11A showing a circuit diagram of an example in which a receiver circuit having a high noise margin is constructed of MOS transistors, FIG. 11B showing an operational characteristic of the receiver circuit and FIG. 11C showing a conceptive diagram for explaining the noise margin, the receiver circuit, designated by reference numeral 23, has P-channel type MOS transistors 231$a$ and 232 and N-channel type MOS transistors 233 and 234$a$ which are connected in series between supply potential and ground potential GND, gate electrodes of these transistors being connected in common to receive an input signal N29, a P-channel type MOS transistor 231$b$ connected in parallel with the P-channel type MOS transistor 231$a$, and an N-channel type MOS transistor 234$b$ connected in parallel with the N-channel type MOS transistor 234$a$. The P-channel type MOS transistor 232 has its drain electrode connected to gate electrodes of the P-channel type MOS transistor 231$b$ and N-channel type MOS transistor 234$b$ through an inverter 235, and an output signal N30 is delivered lout of the inverter 235.

In this receiver circuit 23, since the transistors 231$b$ and 234$b$ contribute to logical threshold values of this circuit in such a manner that the output signal N30 is not liable to be inverted in response to a change in the input signal N29, the output signal will not be inverted before the input signal N29 sufficiently changes toward a high level or a low level.

This type of waveform converter exhibits a high logical threshold value VTHR in response to rise of the input signal and a low threshold value VTHF in response to fall of the input signal and therefore it is a Schmitt circuit having a hysteresis characteristic.

In such a Schmitt circuit, the input signal is not recognized before the input signal reaches VIL or VIH. In this case, noise margins are indicated by NMH=(VOH−VIL) and NML=−(VOL−VIH) and accordingly, the Schmitt circuit can provide large noise margins.

By using the waveform converter having the large noise margins in the receiver circuit, noise in the transmitting signal can be removed.

Referring now to FIG. 12A showing a circuit diagram of an example of a receiver circuit in which the transmission delay time is decreased and FIG. 12B showing an input/output characteristic of the circuit, the receiver circuit is constructed of two of the receiver circuits 23 of FIG. 11A used in combination.

More particularly, the receiver circuit of FIG. 12A differs from the receiver circuit 23 of FIG. 11A in that transistors 241$b$ and 244$b$ of one waveform converter have their gate electrodes connected to a drain electrode of a transistor 247 of the other waveform converter and that an output signal N32 is delivered out of an inverter 245 of the one waveform converter.

In this receiver circuit, a circuit having transistors 246$a$, 247, 248, 249$a$ and 249$b$ forms a Schmitt circuit and the transistors 241$b$ and 244$b$ contribute to logical threshold values in such a manner that the output of the receiver circuit is liable to be inverted in response to a change in an input signal N31. Accordingly, a slight change of the input signal causes the output signal to change.

Namely, the waveform converter as above operates such that it exhibits a low logical threshold value VTHR in response to rise of the input signal and a high logical threshold value VTHF in response to fall of the input signal.

As shown in FIG. 12B, this circuit has an input/output characteristic inverse to that of the aforementioned Schmitt circuit by exhibiting VTHF which is higher than VTHR. When a transmitting signal on the receiving side changes gradually owing to a long transmission line and a load of large capacity and a delay time due to the long transmission line, a change in the transmitting signal can be sensed earlier and the delay time can be reduced by using the receiver circuit as above.

As described above, in the conventional interface circuit of FIG. 8, two transmitting signals of non-inverting and inverting signals are needed for one transmitting signal and in consequence, the number of signal wiring lines for interface increases.

In the conventional interface circuit of FIG. 9A, at least one signal wiring line is needed for transmission of the reference potential in addition to the signal wiring line for the transmitting signal and when bidirectional communication is taken into consideration, at least two signal wiring lines for bidirectional transmission of the reference potential are needed in addition to the signal wiring line for the transmitting signal.

On the other hand, in the interface circuit of FIG. 10, no signal wiring line is needed for transmission of the reference potential but the clock signal must be transmitted necessarily to the receiving side and therefore, when no clock signal is contained in the transmitting signal, a signal wiring line for transmission of the clock signal must be added.

On the other hand, in the receiver circuits 23 and 24 shown in FIGS. 11A and 12A, an optimum margin can be provided by changing VIM and VIL on the receiving side in response to a voltage variation in the transmitting signal but the width of the VIH and VIL cannot be changed, with the result that as the width of VOH and VOL of the transmitting signal is narrowed, the noise margin is also decreased.

Especially, when VOM≦VIM or VOL≧VIL, NMH≦0 or NML≦0 holds and transmission of accurate logic is prevented.

The receiver circuit 23 can afford to have a large noise margin but has a characteristic which is sensitive to a voltage variation in the transmitting signal when the noise margin is increased. More specifically, in the Schmitt circuit, increasing the noise margin means that VIH approaches VOM and VIL approaches VOL and when a voltage variation causes VOM <VIM or VOL>VIL to stand, the noise margin becomes "0" to raise sensitivity to noise.

The receiver circuit 24 decreases the noise margins NMH and NML to permit a change in the transmitting signal to be sensed earlier but because of the small noise margins, its characteristic is sensitive to a voltage variation in the transmitting signal. Namely, when VOM≦VIM or VOL≧VIL holds, NMH≦0 or NML≦0 stands and the receiver cannot recognize logic accurately.

As described above, the conventional interface circuits cannot maintain the noise margin when voltage in the transmitting signal changes and cannot recognize the fact that transmission of accurate logic is prevented owing to the failure to maintain the noise margin.

SUMMARY OF THE INVENTION

The present invention contemplates elimination of the conventional drawbacks and has its object to provide an interface circuit which can permit transmission of accurate logic in a transmission system having different power sources on the transmitting side and receiving side of a transmitting signal, in a transmission system in which supply voltage changes, in a system in which a voltage variation occurs in a transmitting signal and in a transmission system in which a transmitting signal contains noise.

Another object of the invention is to provide an interface circuit which can reduce the number of wiring lines for signal transmission.

According to the present invention, to accomplish the above objects, an interface circuit of a transmission system for transmitting a predetermined signal between the transmitting and receiving sides comprises a receiver circuit having threshold control means for independently controlling a logical threshold value corresponding to rise of a received transmitting signal from low level to high level and a logical threshold value corresponding to fall of the received transmitting signal from high level to low level, and a control circuit for controlling the logical threshold values of the receiver circuit through the threshold control means in response to a voltage variation in the transmitting signal.

For the purpose of receiving the transmitting signal while noise being removed from the transmitting signal, the receiver circuit is a first receiver circuit which exhibits a high logical threshold value corresponding to rise of the input transmitting signal and a low logical threshold value corresponding to fall of the transmitting signal to expand the noise margin, and the control circuit responds to a voltage variation in the transmitting signal to control the first receiver circuit through the threshold control means such that the high-level side logical threshold value is controlled so as to be set to a value which is equal to a minimum level value for permitting the transmitting signal to be delivered as a high level or is higher than the minimum level value and the low-level side logical threshold value is controlled so as to be set to a value which is equal to a maximum level value for permitting the transmitting signal to be recognized as a low level or is lower than the maximum level value.

For the purpose of receiving the transmitting signal while a change in the transmitting signal being sensed earlier to decrease the delay time of the transmitting signal, the receiver circuit is a second receiver circuit which exhibits a low logical threshold value corresponding to rise of the input transmitting signal and a high logical threshold value corresponding to fall of the input transmitting signal to expand the noise margin, and the control circuit controls the second receiver circuit through the threshold control means such that the high-level side logical threshold value is controlled so as to be set to a value which is lower than a minimum threshold value for permitting the transmitting signal to be delivered as a high level and the low-level side logical threshold value is controlled so as to be set to a value which is higher than a maximum level value for permitting the transmitting signal to be delivered as a low level.

The control circuit responds to a voltage variation in the transmitting signal to control the second receiver circuit through the threshold control means such that the high-level side logical threshold value is controlled so as to be set to a value which is equal to a minimum level value for permitting the transmitting signal to be delivered as a high level or lower than the minimum level value and the low-level side logical threshold value is controlled so as to be set to a value which is equal to a maximum level value for permitting the transmitting signal to be recognized as a low level or higher than the maximum level value.

Control signals for controlling the logical threshold values of the first and second receiver circuits are generated from the transmitting signal exclusive of a transmitting signal for generation of at least the reference potential and a transmitting signal of the reference potential per se.

According to the present invention, an interface circuit of a transmission system for transmitting a predetermined signal from the transmitting side to the receiving side comprises a receiving side circuit for receiving a transmitting signal of a received object signal, a transmitting signal of supply voltage and a transmitting signal of ground potential, and the receiving side circuit includes a receiver circuit having a first circuit which has different logical threshold values for directions of level changes of the object signal and controls these logical threshold values and a second circuit which is set with an operational characteristic in which a threshold value for delivery of a high level is lower than a predetermined reference value on the high-level side and a threshold value for delivery of a low level is higher than a predetermined reference value on the low-level side and has a characteristic inverse to that of the first circuit, reference voltage generating means for generating high level and low level control signals for controlling the logical threshold values from the transmitting signal of the supply voltage and the transmitting signal of the ground potential, control signal deciding means for deciding whether the high level and low level control signals satisfy predetermined voltage levels, high-level deciding means responsive to the high-level control signal to decide whether the transmitting signal of the supply voltage can be recognized as the predetermined high level, low-level deciding means responsive to the low-level control signal to decide whether the transmitting signal of the ground potential can be recognized as the predetermined low level, and supply level deciding means for detecting coincidence of output signals of the control signal deciding means, high-level deciding means and low-level deciding means and delivering a decision result.

In the present invention, when elimination of noise of a transmitting signal is intended, a Schmitt circuit is used for the receiver circuit to increase the noise margin and the Schmitt circuit is of the type having logical threshold values VTHR and VTHF which are controllable. Namely, the logical threshold values are controlled in accordance with a voltage variation in the transmitting signal. The Schmitt circuit is defective in that when the noise margin is increased, VOH<VIH or VOL>VIL tends to occur in response to a voltage variation in the transmitting signal but by controlling the logical threshold values, the above defect can be prevented. When a change in the transmitting signal is sensed earlier with the aim of reducing the delay time, a circuit having a characteristic inverse to that of the Schmitt circuit is used for the receiver circuit. This circuit is also of the type having logical threshold values VTHR and VTHF which are controllable. Namely, the logical threshold values are controlled in accordance with a voltage variation in the transmitting signal. The receiver circuit with a small noise margin is defective in that by a voltage variation in the transmitting signal, VOH≦VIH and VOL≧VIL, that is, a state of noise margin of "0" represented by NMH≦0 or NML≦0 is liable to occur to prevent transmission of accurate logic, but this defect can also be prevented by controlling the logical threshold values.

Further, since the control signals for controlling the logical threshold values of the receiver circuit are generated from the transmitting signal, transmission of a signal for generation of the reference potential on the receiving side and transmission of the reference potential per se can be unneeded and the number of signal wiring lines can be reduced.

Furthermore, the receiver circuit having logical threshold values which are different for directions of level changes of the input signal and which are controllable is uses and hence by deciding whether voltage in the transmitting signal varies and whether accurate logic can be recognized from the transmitting signal subject to the voltage variation, reliability of signal transmission can be improved.

BRIEF DESCRIPTION OF THE DRAWINGS

FIG. 1 is a schematic block diagram showing a first embodiment of a receiving side circuit of an interface circuit of the present invention.

FIG. 2 is a block diagram showing a concrete configuration of the circuit of FIG. 1.

FIG. 6 is a schematic block diagram showing a second embodiment of the receiving side circuit of the interface circuit of the present invention.

DESCRIPTION OF THR PREFERRED EMBODIMENTS

Figure 3A:
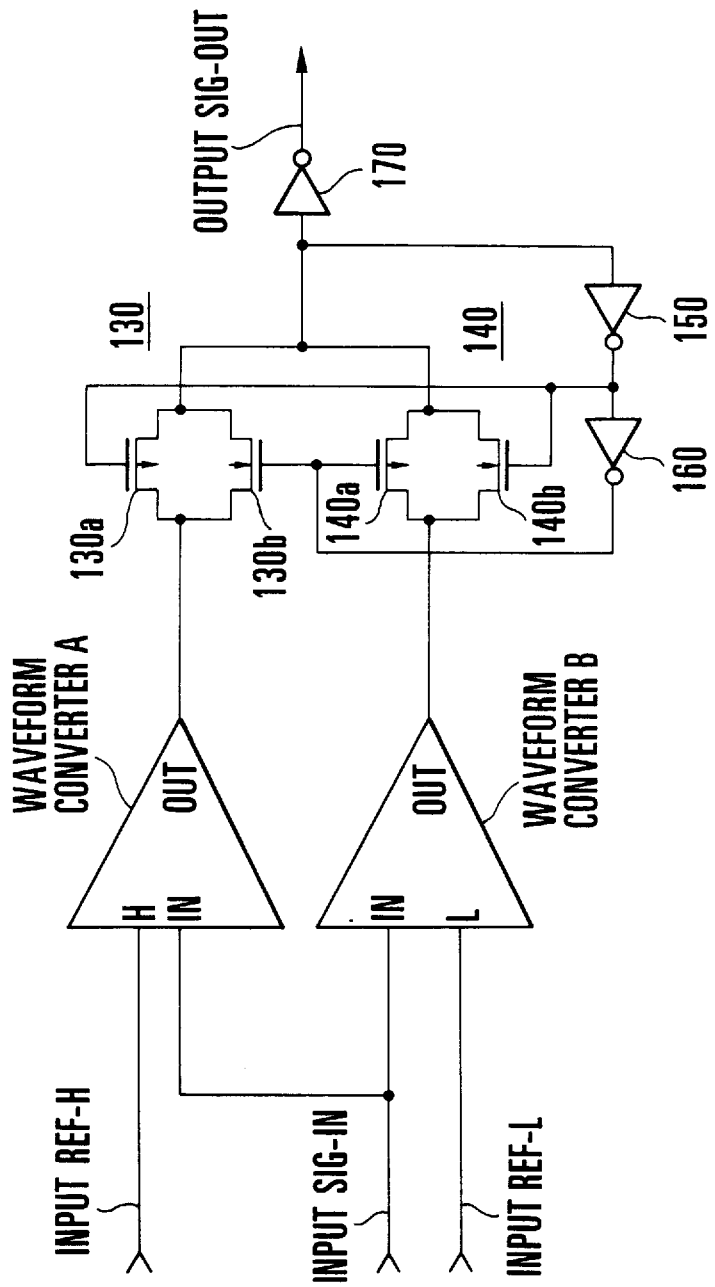
FIG. 3A is a circuit diagram showing an example of a control circuit 1 in FIG. 2.

The present invention will now be described by way of example with reference to the accompanying drawings.

Referring to FIG. 1, a first embodiment of a receiving side circuit of an interface circuit according to the invention is illustrated in schematic diagram form. As shown, the interface circuit as generally designated by reference numeral 100 comprises a first control circuit 1 serving as a receiver circuit and a second control circuit 2 for controlling logical threshold values of the first control circuit 1. An input signal N11 received from a transmission line is supplied to the first and second control circuits 1 and 2, an output signal N13 of the control circuit 2 is supplied to a control terminal of the control circuit 1, and an output signal N12 is delivered out of the control circuit 1.

The control circuit 2 responds to logical high and low levels of the input signal N11 to produce the signal N13 which in turn controls the control circuit 1 such that the control circuit 1 can recognize logic of the input signal N11. Each of the control circuits 1 and 2 and each of the signals N11 to N13 may be either singular or plural.

Referring to FIG. 2, a particular configuration of the aforementioned receiving side circuit is shown in block diagram from. As shown, the receiving side circuit generally designated by reference numeral 300 comprises a control circuit 1 including a plurality of receiver circuits 11 to 1n each having input terminals IN, H and L and an output terminal OUT, and a single control circuit 2 for controlling threshold values of the control circuit 1. Corresponding transmission signals N111 to N11n are supplied to the input terminals IN of these receiver circuits 11 to 1n and to input terminals of the control circuit 2. The control circuit 2 generates output signals N131 and N132, of which the signal N131 is provided to the corresponding H terminals of the receiver circuits 11 to 1n and the signal N132 is inputted in common to the corresponding L terminals, and output signals N121 to N12n of the receiver circuits 11 to in are delivered via the OUT terminals.

Figure 3B:
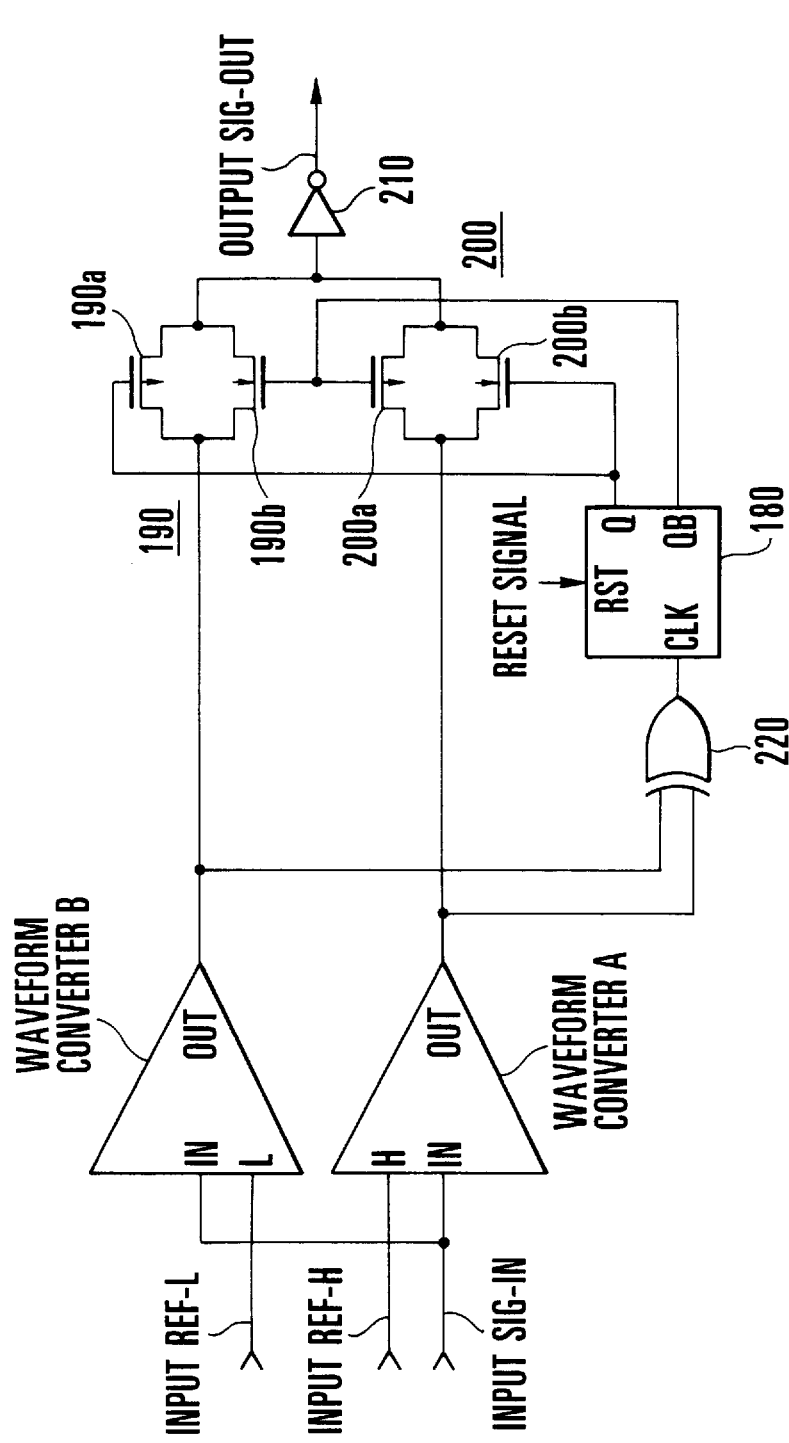
FIG. 3B is a circuit diagram showing another example of the control circuit 1 of FIG. 2.

Referring to FIGS. 3A and 3B, particular examples of each of the aforementioned Schmitt circuits 11 to in each having the input terminals IN, H and L and the output terminal OUT are illustrated in block diagram form. Each example includes a waveform converter A with input terminals IN and H and an output terminal OUT as exemplified in FIG. 4A and a waveform converter B with input terminals IN and L and an output terminal OUT as exemplified in FIG. 4B.

Referring first to FIG. 3A, the H terminal of the waveform converter A is supplied with a control signal REF-H, the L terminal of the waveform converter B is supplied with a control signal REF-L, and the IN terminal of each of the converters A and B is supplied with an input signal SIG-IN. The output terminal OUT of the waveform converter A is connected to an input terminal of a transfer gate 130 comprised of transistors 130a and 130b, the output terminal OUT of the waveform converter B is connected to a transfer gate 140 comprised of transistors 140a and 140b, and 4 output terminals of the transfer gates 130 and 140 are connected in common to input terminals of an inverter 150 and an output buffer 170. The output buffer 170 delivers an output signal SIG-OUT, an output terminal of the inverter 150 is connected to gate electrodes of the transistors 130a and 140b and to an input terminal of an inverter 160, and an output terminal of the inverter 160 is connected to gate electrodes of the transistors 130b and 140a.

Turning to FIG. 3B, a control signal REF-H is supplied to the H terminal of the waveform converter A, a control signal REF-L is supplied to the L terminal of the waveform converter B, and an input signal SIG-IN is supplied to the IN terminal of each of the converters. The output terminal of the waveform converter B is connected to an input terminal of a transfer gate 190 comprised of transistors 190a and 190b and the output terminal of the waveform converter A is connected to an input terminal of a transfer gate 200 comprised of transistors 200a and 200b. Output terminals of the transfer gates are connected in common to an input terminal of an output buffer 210 and an output signal SIG-OUT is delivered out of the output buffer 210. The output terminals of the waveform converters A and B are also connected to input terminals of an exclusive OR circuit 220 having its output terminal connected to a CLK terminal of a flip-flop circuit 180. The flip-flop circuit 180 has its RST terminal which is supplied with a reset signal at a predetermined timing, its output terminal Q connected to gate electrodes of the transistors 190a and 200b and its output terminal QB connected to gate electrodes of the transistors 190b and 200a.

Figure 4A:
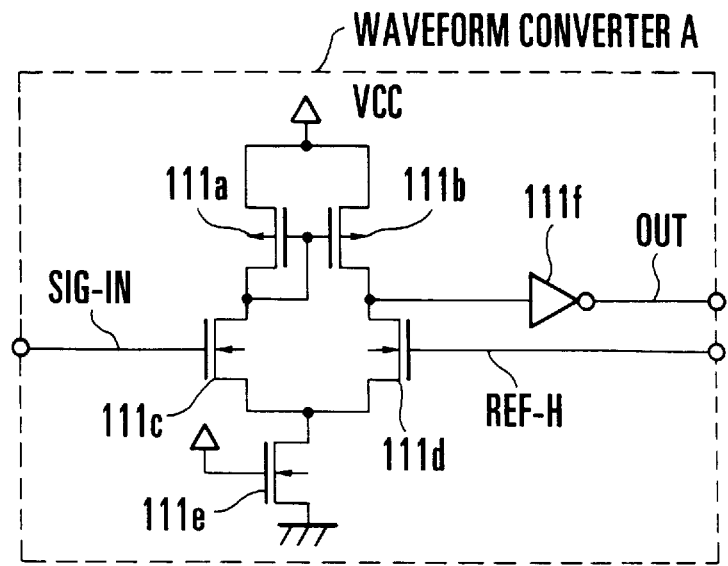
FIG. 4A is a circuit diagram of a waveform converter A in FIGS. 3A and 3B.

Referring to FIG. 4A, the waveform converter A is a differential amplifier including paired transistors 111a and 111b having drain electrodes connected to supply potential VCC and gate electrodes connected to a source electrode of one of the paired transistors, a transistor 111c having its drain electrode connected to the source electrode of one 111a of the paired transistors which has its source electrode and gate electrode connected in common to each other, and a transistor 111d having its drain electrode connected to a source electrode of the transistor 111b. Source electrodes of the transistors 111c and 111d are connected to a drain electrode of a transistor 111e having its source electrode connected to ground potential. A gate electrode of the transistor 111c is supplied with the input signal SIG-IN and a gate electrode of the transistor 111d is supplied with the input signal REF-H. The drain electrode of the transistor 111d is also connected to an input terminal of an inverter 111f which in turn delivers a signal output through its output.

Figure 4B:
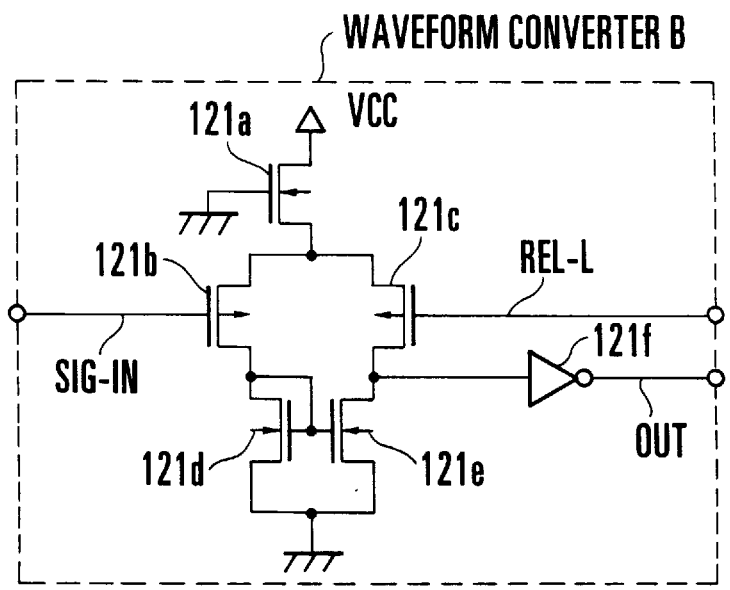
FIG. 4B is a circuit diagram of a waveform converter B in FIGS. 3A and 3B.

Turning to FIG. 4B, the waveform converter B is a differential amplifier including a transistor 121a having its drain electrode connected to the supply potential VCC and its gate electrode connected to ground potential, and transistors 121b and 121c having their source electrodes connected in common to a source electrode of the transistor 121a and having their drain electrodes connected to drain electrodes of paired transistors 121d and 121e having their source electrodes connected in common to ground potential GND and their gate electrodes connected in common to the drain electrode of one of the paired transistors 121d and 121e. A gate electrode of the transistor 121b is supplied with the input signal SIG-IN and a gate electrode of the transistor 121c is supplied with the input signal REF-L. The drain electrode of the transistor 121e is connected to an input terminal of an inverter 121f which in turn delivers a signal output through its output.

The above waveform converter A is the differential amplifier of a CMOS configuration which exhibits an inverter characteristic by using the control signal REF-H supplied to the H terminal as a logical threshold value. Similarly, the converter B is the differential amplifier of a CMOS configuration which exhibits an inverter characteristic by using the control signal REF-L supplied to the L terminal as a logical threshold value.

Figure 5:
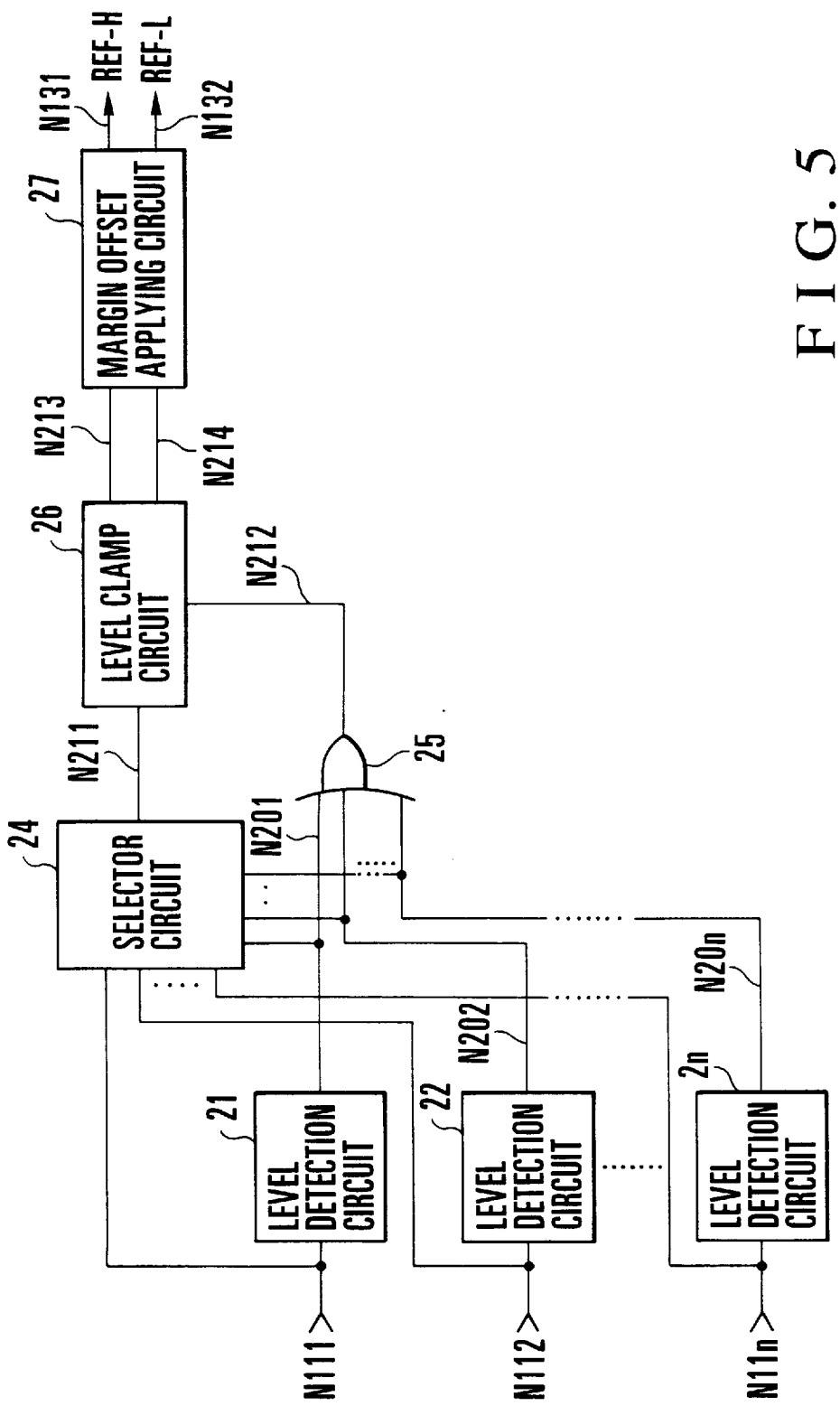
FIG. 5 is a block diagram showing the construction of a control circuit 2 in FIG. 2.

Referring to FIG. 5, the control circuit 2 illustrated in block diagram form includes level detection circuits 21 to 2n which receive transmitting signals N111 to N11n, detect change edges from high level to low level or change edges from low level to high level of the transmitting signals and deliver change detection signals N201 to N20n. Each of the output signals N201 to N20N may be on plural signal lines. For example, separate lines may be used for signal rise and fall edges, level signal lines may be used for signals to a selector circuit 24 and pulse signal lines may be used for signals to a level clamp circuit 26.

The selector circuit 24 receives the transmitting signals N111 to N11n and the change detection signals N201 to N20n and selects a transmitting signal undergoing a signal change from the plurality of transmitting signals so as to deliver a signal N211.

The level clamp circuit 26 receives the signal N211 and an output signal N212 of an OR circuit 25 for OR-ing the change detection signals N201 to N20n, clamps a high level or a low level of the signal N212 and delivers a high level clamp signal N213 or a low level clamp signal N214.

When the output signal N211 of the selector circuit 24 changes from low level to high level, the level clamp circuit 26 clamps the high level after level change and delivers the signal N213. When the signal N211 changes from high level to low level, the low level after level change is clamped and the signal N214 is delivered. In other words, the high level clamp signal N213 and the low level clamp signal N214 indicate a high level and a low level of a transmitting signal which has undergone a nearby change, that is, VOH and VOL on the signal transmitting side.

A margin offset applying circuit 27 receives the output signals N213 and N214 of the level clamp circuit and generates an output signal N131 having a voltage level obtained by subtracting a margin offset voltage from a voltage level of the high level clamp signal N213 and an output signal N132 having a voltage level obtained by adding the margin offset voltage to a voltage level of the low level clamp signal N214.

The output signals N131 and N132 are reference signals which determine threshold values for deciding the high level and low level of the input transmitting signals to the waveform converter circuits A and B, respectively.

Reverting to FIG. 2, the circuit as shown in FIG. 3A is used for the receiver circuit when noise is removed from a transmitting signal and an object signal is extracted and the circuit as shown in FIG. 3B is used for the receiver circuit when a change of a transmitting signal is sensed earlier to decrease the delay time and an object signal is extracted.

In FIG. 3A, for the high level of the input signal SIG-IN, the high level is inverted at a predetermined threshold level in the waveform converter A and a low level signal is selectively delivered to the SIG-OUT terminal and for the low level of the input signal SIG-IN, the low level is inverted at a predetermined threshold level in the waveform converter B and a high level signal is selectively delivered to the SIG-OUT terminal.

When the control signals REF-H and REF-L for controlling the logical threshold values of the waveform converters A and B are set to a condition of (REF-H)>(REF-L), the circuit shown in FIG. 3A operates as a Schmitt circuit which exhibits a high logical threshold value for rise of the input signal to the high level and a low logical threshold value for fall of the input signal to the low level. Namely, selective delivery of the high logical threshold value when the input signal rises to the high level and selective delivery of the low logical threshold value when the input signal falls to the low level can be controlled independently of each other by the REF-H signal and the REF-L signal, respectively.

In FIG. 3B, responsive to rise of the input signal SIG-IN to the high level, a low level signal obtained by inversion at a predetermined threshold value in the waveform converter B is selectively delivered to the SIG-OUT terminal and responsive to fall of the input signal SIG-IN to the low level, a high level signal obtained by inversion at a predetermined threshold value in the waveform converter A is selectively delivered to the SIG-OUT terminal.

The circuit shown in FIG. 3B operates to exhibit a low logical threshold value in response to rise of the input signal to the high level and a high logical threshold value in response to fall of the input signal to the low level when the control signals REF-H and REF-L for controlling logical threshold values of the waveform converters A and B are set to a condition of (REF-H)>(REF-L) in advance. In other words, it operates as a receiver circuit which exhibits a characteristic inverse to that of the Schmitt circuit, so that selective delivery of the low logical threshold value responsive to rise to the high level and selective delivery of the high logical threshold value responsive to fall to the low level can be controlled independently of each other by the control signals supplied to the L and H terminals, respectively.

In FIG. 2, the control signal N131 supplied from the control circuit 2 serves as a signal for controlling the logical threshold value on the high level side for input signals to the receiver circuits 11 to in incorporated in the control circuit 1 of the receiver circuit 300 and the signal N132 serves as a signal for controlling the logical threshold value on the low level side. The control circuit 2 controls the signals N131 and N132 such that a change from low level state to high level state and a change from high level state to low level state of the transmitting signals N111, N112, . . . , N11n are detected, the high level and the low level of the transmitting signals after the state change has completed are sampled, and the receiver circuits 11 to 1n can recognize the high level and low level of the received transmitting signals.

As the received transmitting signal changes from high level to low level or vice versa, a changed state is detected and potential at the changed state is sampled to internally fetch information concerning a voltage variation in the transmitting signal due to a voltage variation occurring in the transmission path. On the basis of the thus fetched voltage variation information, the receiver circuit 300 independently controls the logical threshold value corresponding to rise of the transmitting signal to the high level and the logical threshold level corresponding to fall to the low level, thereby maintaining noise margins even for the transmitting signal accompanied by the voltage variation.

When a transmitting signal is received while being removed of noise, a large noise margin is supplied to the control circuit 1 of the receiving side circuit 300 by using the Schmitt circuits 11 to 1n and the logical threshold values are controlled in accordance with a voltage variation in the transmitting signal. Accordingly, even with the Schmitt circuit of large noise margin which is liable to take a state of VOH<VIH or VOL>VIL in accordance with a voltage variation in the transmitting signal, a defect of failure to permit transmission of accurate logic can be prevented.

When a change in a transmitting signal is sensed earlier so as to receive the transmitting signal while decreasing the delay time, the logical threshold value is controlled in accordance with a voltage variation in the transmitting signal by using a receiver circuit which employs a control circuit having a characteristic inverse to that of the Schmitt circuit. The receiver circuit having the characteristic inverse to that of the Schmitt circuit has a small noise margin and takes a state of VOH$\leq$VIH or VOL$\geq$VIL, that is, NMH$\leq$0 or NML$\leq$0 in accordance with a voltage variation in the transmitting signal, with the result that noise margin is lost and transmission of accurate logic cannot be effected. But such a disadvantage can be prevented by controlling the threshold values.

In the system using the circuit as above, the voltage change is sampled from the voltage change in the received transmitting signal and consequently, any signal line dedicated to acquirement of information concerning voltage change need not be provided particularly. When a signal which changes in state frequently and has the known signal contents, such as a clock signal, is contained in the transmitting signals N111 to N11n, the number of transmitting signal lines for detecting a change in signal state to sample potential can be reduce by one at the least.

Referring to FIG. 6, a schematic configuration of a second embodiment of the present invention is illustrated. Details of the FIG. 6 configuration are shown in block diagram form in FIG. 7. A receiving side circuit 200 of an interface circuit in FIG. 6 comprises first to third control circuits 1, 2 and 3 which are supplied in common with an input signal N11. An output signal N13 of the control circuit 2 is supplied to control terminals of the control circuits 1 and 2, an output signal N12 is delivered out of the control circuit 1 and an output signal N14 is delivered out of the control circuit 3.

As in the case of the first embodiment, the input signal N11 is a transmitting signal in the interface circuit. The control circuit 1 is a receiver circuit of the interface circuit and its logical threshold values are controlled by the control signal N13. The control circuit 2 controls the control circuit 1 by using the signal N13 such that the control circuit 1 can recognize logic of the transmitting signal N11 in accordance with logical high and low levels of the transmitting signal N11. The control circuit 3 responds to the transmitting signal N11 and the control signal N13 for control of logical threshold values to decide whether accurate recognition of logic from the transmitting signal N11 is possible and delivers the output signal N14. Each of the control circuits 1, 2 and 3, transmitting signal N11, output signal N12, control signal N13 and output signal N14 may be either single or plural.

Figure 7:
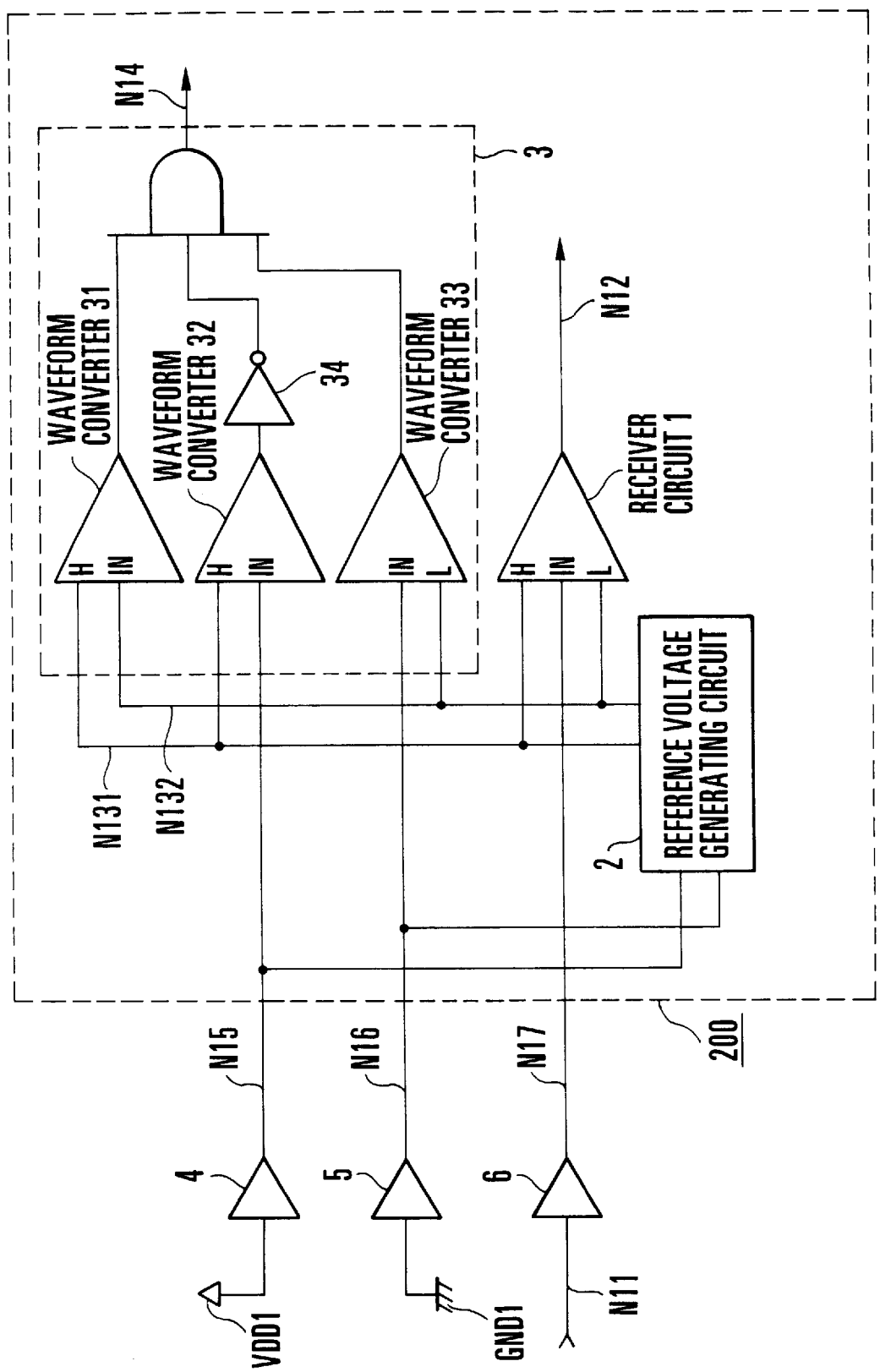
FIG. 7 is a circuit diagram showing a concrete configuration of the circuit of FIG. 6.
Figure 8:
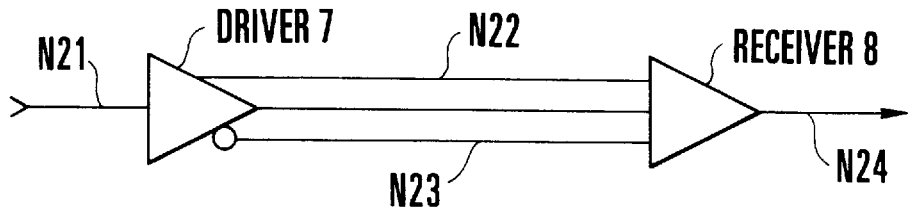
FIG. 8 is a schematic diagram showing a conventional interface circuit.
Figure 9A:
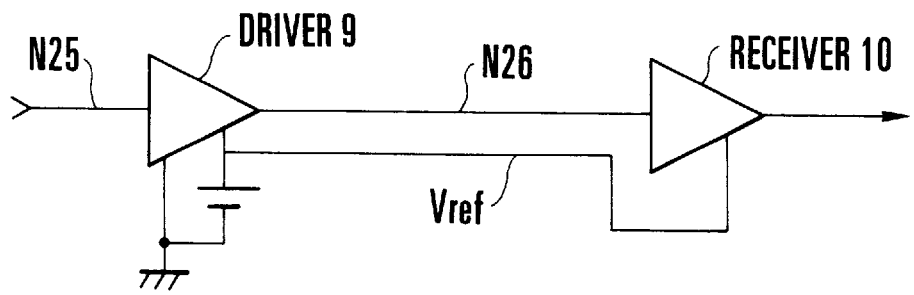
FIG. 9A is a schematic diagram showing another conventional interface circuit.
Figure 9B:
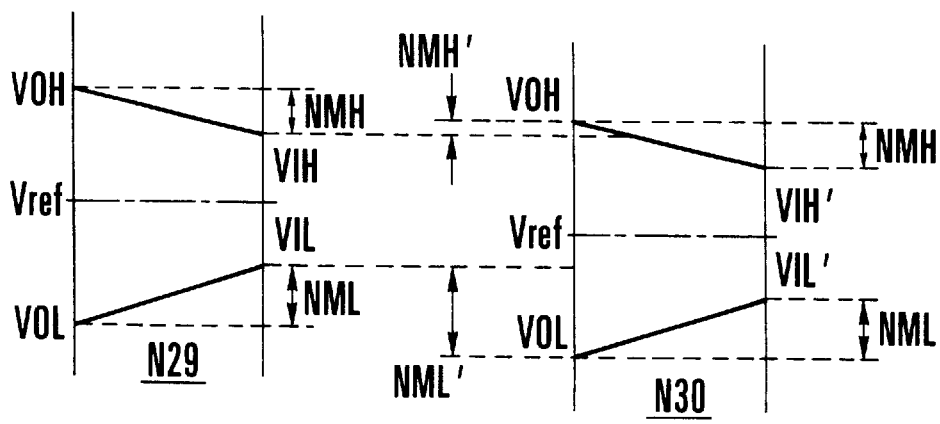
FIG. 9B is a diagram for explaining logical threshold values in the FIG. 9A circuit.
Figure 10:
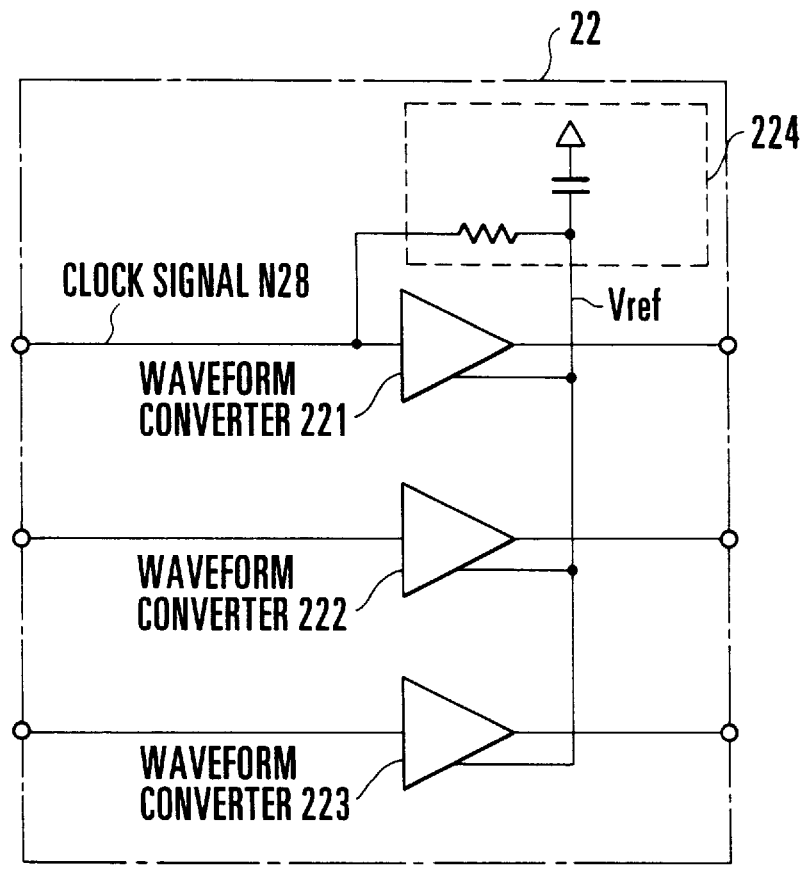
FIG. 10 is a circuit diagram showing a conventional receiver circuit.
Figure 11A:
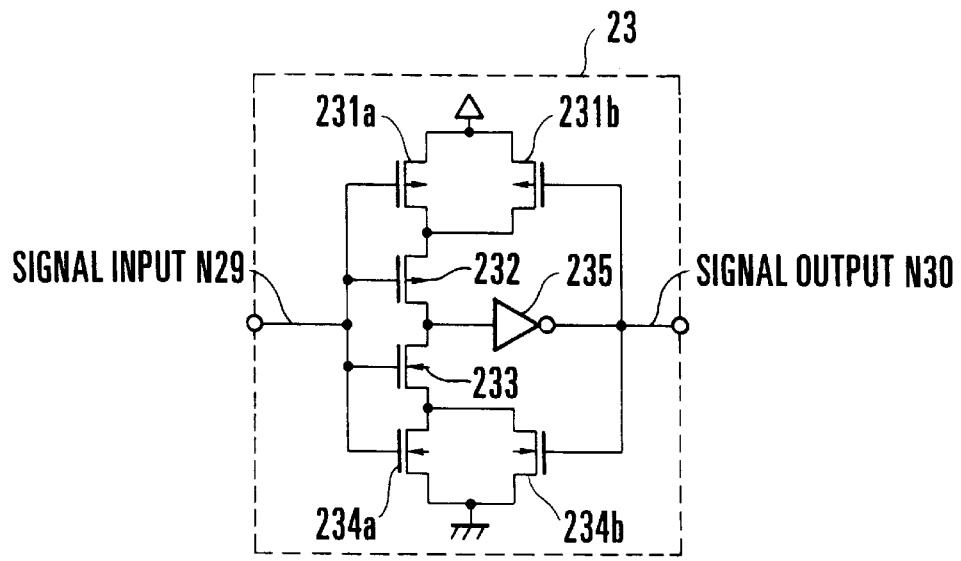
FIG. 11A is a circuit diagram showing details of a conventional receiver circuit.
Figure 11B:
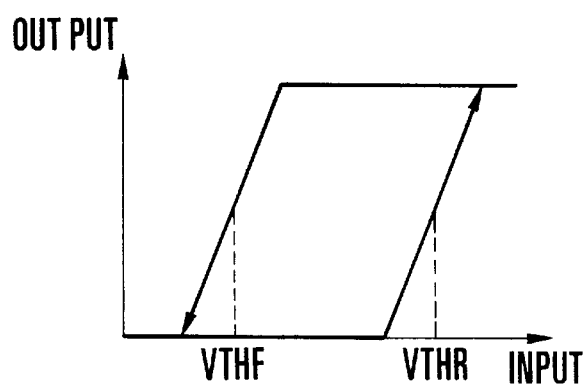
FIG. 11B is a graph for explaining an operating characteristic of the FIG. 11A receiver circuit.
Figure 11C:
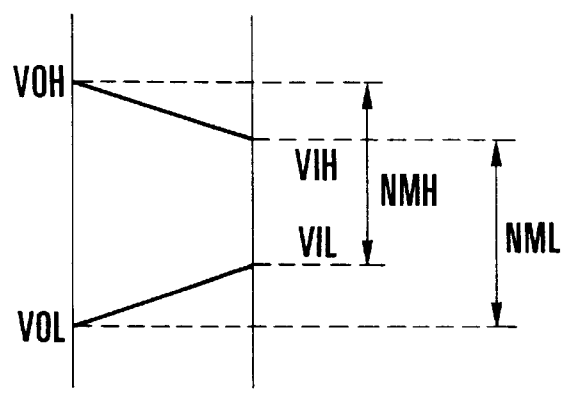
FIG. 11C is a diagram for explaining logical threshold values in the FIG. 11A receiver circuit.
Figure 12:
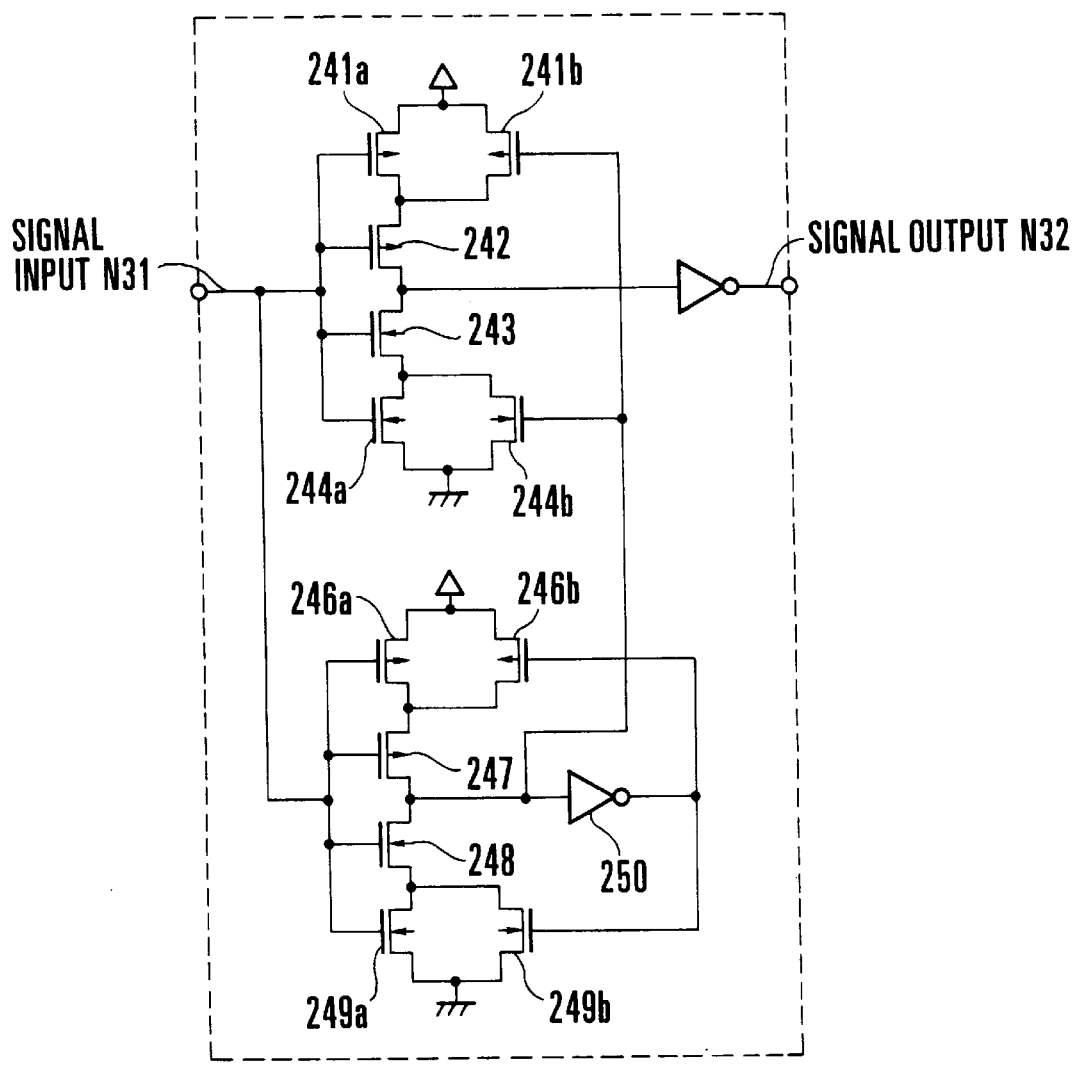
FIG. 12A is a circuit diagram showing still another conventional receiver circuit.
FIG. 12B is a graph for explaining an operating characteristic of the FIG. 12A circuit.
Figure 12:
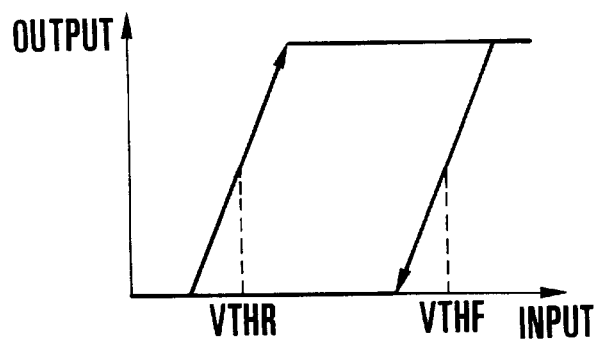

Referring to FIG. 7 showing the construction of the above receiving side circuit 200, the interface circuit to which this receiving side circuit 200 is applied comprises, on the transmitting side, a waveform converter 4 which is supplied with supply potential VD1 and delivers a transmitting signal N15, a waveform converter 5 which is supplied with ground potential GND1 and delivers a transmitting signal N16, and a waveform converter 6 which is supplied with a transmitting signal N11 to be transmitted and delivers a transmitting signal N17. The interface circuit comprises, on the receiving side, the control circuit 2 (hereinafter referred to as reference voltage generating circuit) which receives the transmitting signals N15 and N16 and delivers reference voltages N131 and N132 corresponding to the control signal N13 to the control circuits 1 and 3, the control circuit 1 which receives the transmitting signal N17 and delivers the signal N12 in response to the reference voltages N131 and N132, and the control circuit 3 which receives the transmitting signals N15 and N16 and delivers the output signal N14 in response to the reference voltages N131 and N132.

It is to be noted that the supply potential VDD1 and ground potential GND are transmitted from a constant voltage source on the transmitting side, the waveform converters 4, 5 and 6 are driver circuits, the signals N15, N16 and N17 are transmitting signals and the transmitting signal N11 is an object signal.

The control circuit 1 includes receiver circuits using the Schmitt circuits of FIG. 3A when the transmitting signal is received while being removed of noise or receiver circuits using the circuits of FIG. 3B when the transmitting signal is received while its change being sensed earlier to decrease the delay time. Each of the receiver circuits receives the transmitting signal at its input terminal IN, the reference voltage N131 (REF-H) at its H terminal and the reference voltage N132 (REF-L) at its L terminal. Each of the transmitting signal N11, driver circuit 6, transmitting signal N17 and control circuit 1 may be plural.

Like the first embodiment, the control circuit 3 uses the waveform converters A and B used in the receiver circuits of FIGS. 3A and 3B for waveform converters 31, 32 and 33. The converter 31 receives the high level side reference voltage N131 (REF-H) of the reference voltage generating circuit 2 at the H terminal and the low level side reference voltage N132 (REF-L) at the terminal IN. The converter 32 receives the reference voltage N131 (REF-H) at the H terminal and the output signal N15 of the driver 4 at the terminal IN. The converter 33 receives the reference voltage N132 (REF-L) at the L terminal and the output signal N16 of the driver 5 at the terminal IN. Of these converters 31, 32 and 33, the converter 32 delivers an output signal to one of input terminals of an three-input AND circuit 35 via an inverter 34 and other converters 31 and 33 deliver output signals directly to other input terminals of the three-input AND circuit 35. The three-input AND circuit ANDs these signals to deliver a signal N14.

Of high-level side and low-level side two logical threshold values for the transmitting signal N11, the control circuit 1 can control the high-level side logical threshold value in accordance with the reference voltage N131 and the low-level side logical threshold value in accordance with the reference voltage N132.

The reference voltage generating circuit 2 delivers a potential lower than the transmitting signal N15 by several of one-tenths as the reference voltage N131 and delivers a potential higher than the transmitting signal N16 by several of one-tenths as the reference voltage N132.

The control circuit 3 includes the waveform converters 31, 32 and 33 each having the same construction as the waveform converter in the control circuit 1 for determining the two logical threshold values for the transmitting signal N11, and a circuit for decoding output signals of the waveform converters. The waveform converter 31 decides whether the reference voltages N131 and N132 satisfy a condition of N131>N132, the waveform converter 32 decides whether the transmitting signal N15 can be recognized as high level in relation to a reference potential of the reference voltage N131, and the waveform converter 33 decides whether the transmitting signal N16 can be recognized as low level in relation to a reference potential of the reference voltage N132. When the above three conditions are all satisfied, the signal N14 is delivered in the form of a high-level signal.

The receiving side circuit 200 uses the N15 and N16 of the received transmitting signals as reference signals for high and low levels, respectively, the reference voltage generating circuit 2 generates the reference voltages N131 and N132 for controlling the two logical threshold values of the control circuits 1 and 3, so that the logical threshold value for rise of the transmitting signal to of the receiving side circuit to high level and the logical threshold value for fall to low level can be controlled independently on the basis of information concerning a voltage variation in the transmitting signal, thereby ensuring that the noise margin can be maintained even in the presence of the voltage variation in the transmitting signal to permit transmission of accurate logic and to make it possible to decide from the transmitting signal whether accurate logic can be recognized so as to improve reliability of signal transmission.

As described above, in the interface circuit of the present invention, a large noise margin is provided by using a Schmitt circuit in the receiver circuit when the transmitting signal is received while being removed of noise and a circuit which can control the high-level side logical threshold level and the low-level side logical threshold level of the input signal is used in combination with the Schmitt circuit to control the logical threshold values in accordance with a voltage variation in the transmitting signal, thereby preventing such defects of the Schmitt circuit that when the noise margin is made to be large, a voltage variation in the transmitting signal causes the transmitting side output voltage high level to tend to be lower than the receiving side input voltage high level and the transmitting side output voltage low level to tend to be higher than the receiving side input voltage low level and consequently transmission of accurate logic is prevented.

When the transmitting signal is received while a change in the transmitting signal being sensed earlier to decrease the delay time, a receiver circuit having a characteristic inverse to that of the Schmitt circuit is used and a circuit which can control the high-level side logical threshold value and the low-level side logical threshold value of the input signal is used in combination with the receiver circuit so as to control the logical threshold values in accordance with a voltage variation in the transmitting signal, thereby preventing such defects of the receiver circuit of small noise margin that a voltage variation in the transmitting signal causes the transmitting side output voltage high level to tend to be equal to or smaller than the receiving side input voltage high level and the transmitting side output voltage low level to tend to be equal to or larger than the receiving side input voltage low level, that is, causes the high-level side noise margin to tend to be 0 level or less and the low-level side noise margin to tend to be 0 level or less and consequently transmission of accurate logic is prevented.

Further, by generating the control signal for control of the logical threshold values of the receiver circuit from the transmitting signal, transmission of a signal for generation of reference potential or transmission of the reference potential per se can be unneeded and the number of signal wiring lines can be reduced.

Further, by controlling the logical threshold value in accordance with a voltage variation in the transmitting signal by means of a receiver circuit which has different controllable logical threshold values in the directions of level changes of the input signal, transmission of accurate logic can be effected and by deciding from the transmitting signal subject to a voltage variation whether recognition of accurate logic is possible, reliability of signal transmission can be improved.

What is claimed is:

1. An interface circuit having a transmitting side circuit, a receiving side circuit and a transmission path connecting the transmitting side circuit and the receiving side circuit in a transmission system for transmitting a predetermined signal between the transmitting and receiving sides, said receiving side circuit comprising:

a control circuit for generating a high logical threshold value corresponding to a rise of a received transmitting signal from a low level to a high level and a low logical threshold value corresponding to a fall of the received transmitting signal from a high level to a low level, wherein said high logical threshold value and said low logical threshold value are controlled independently of each other;

a receiver circuit for determining a high level and a low level of the received transmitting signal based on said high logical threshold value and said low logical threshold value generated by said control circuit.

2. An interface circuit according to claim 1, wherein said receiver circuit receives a high logical threshold value corresponding to rise of the input transmitting signal and a low logical threshold value corresponding to fall of the transmitting signal to expand a noise margin for receiving a high-level and a low-level input transmitting signal, and said control circuit responds to a voltage variation in the transmitting signal to control the high logical threshold value to be set to a value which is equal to or higher than a minimum level value for permitting the transmitting signal to be delivered as a high level and the low logical threshold value to be set to a value which is equal to or lower than a maximum level value for permitting the transmitting signal to be recognized as a low level.

3. An interface circuit according to claim 2, wherein said receiver circuit is a Schmitt circuit.

4. An interface circuit according to claim 1, wherein said receiver circuit receives the low logical threshold value corresponding to rise of the input transmitting signal and the high logical threshold value corresponding to fall of the input transmitting signal to expand a noise margin for receiving a high-level and a low-level input transmitting signal, and said control circuit controls the high logical threshold value to be set to a value which is lower than a minimum threshold value for permitting the transmitting signal to be delivered as a high level and the low logical threshold value to be set to a value which is higher than a maximum level value for permitting the transmitting signal to be delivered as a low level.

5. An interface circuit according to claim 4, wherein said receiver circuit is an inverse Schmitt circuit.

6. An interface circuit according to claim 4, wherein said control circuit responds to a voltage variation in the transmitting signal to control the high logical threshold value to be set to a value which is equal to or lower than a minimum level value for permitting the transmitting signal to be delivered as a high level and the low logical threshold value to be set to a value which is equal to or higher than a maximum level value for permitting the transmitting signal to be recognized as a low level.

7. An interface circuit according to claim 2 or 4, wherein the logical threshold values are generated based on only the transmitting signal.

8. An interface circuit having a transmitting side circuit, a receiving side circuit and a transmission path connecting the transmitting side and receiving side circuits in a transmission system for transmitting a predetermined signal from the transmitting side to the receiving side, said receiving side circuit receiving a transmitting signal, a supply voltage signal and a ground potential signal, said receiving side circuit comprising:

a receiver circuit having a first circuit which has different logical threshold values for directions of level changes of the object signal and controls said different logical threshold values and a second circuit which is set with an operating characteristic in which a threshold value corresponding to a high level is lower than a predetermined reference value on the high-level side and a threshold value corresponding to a low level is higher than a predetermined reference value on the low-level side and has a characteristic inverse to that of said first circuit;

reference voltage generating means for generating high level and low level control signals for controlling logical threshold values from the the supply voltage signal and the ground potential signal;

control signal deciding means for deciding whether the high level and low level control signals are equal to predetermined voltage levels;

high-level deciding means responsive to the high-level control signal and the supply voltage signal to decide whether the supply voltage signal is equal to a predetermined high level;

low-level deciding means responsive to the low-level control signal and the the ground potential signal to decide whether the ground potential signal is equal to a predetermined low level; and supply level deciding means for determining whether an output signal of said control signal deciding means indicates that the high level and low level control signals are equal to the predetermined voltage levels, an output signal of the high-level deciding means indicates that the supply voltage signal is equal to the predetermined high level, and an output signal of the low level deciding means indicates that the ground potential signal is equal to the predetermined low level, and delivering a decision result.

* * * * *

UNITED STATES PATENT AND TRADEMARK OFFICE
CERTIFICATE OF CORRECTION

PATENT NO.: 5,856,750
DATED: January 05, 1999
INVENTOR(S): Yoichi KOSEKI

It is certified that error(s) appears in the above-identified patent and that said Letters Patent is hereby corrected as shown below:

Column 4, Line 65: delete "VIM" and insert --VIH--

Column 5, Line 3: delete "VOM $\leq$ VIM" and insert --VOH $\leq$ VIH--

Column 5, Line 10: delete "VOM" and insert --VOH--

Column 5, Line 12: delete "VOM < VIM" and insert --VOH < VIM--

Column 8, Line 55: delete "in" and insert --1n--

Column 8, Line 58: delete "in" and insert --1n--

Signed and Sealed this

Twentieth Day of July, 1999

Q. TODD DICKINSON

*Attest:*

*Attesting Officer*   Acting Commissioner of Patents and Trademarks